United States Patent
Turner et al.

(10) Patent No.: US 8,829,932 B2
(45) Date of Patent: Sep. 9, 2014

(54) NO PIN TEST MODE

(75) Inventors: John R. Turner, Portland, ME (US); Nathan Charland, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 319 days.

(21) Appl. No.: 13/188,802

(22) Filed: Jul. 22, 2011

(65) Prior Publication Data

US 2012/0019273 A1 Jan. 26, 2012

Related U.S. Application Data

(60) Provisional application No. 61/367,280, filed on Jul. 23, 2010.

(51) Int. Cl.
   *G01R 31/3187* (2006.01)
   *G01R 31/28* (2006.01)
   *G01R 31/317* (2006.01)

(52) U.S. Cl.
   CPC ...... *G01R 31/2844* (2013.01); *G01R 31/31701* (2013.01); *G01R 31/2884* (2013.01)
   USPC .......................... 324/750.3; 324/76.39; 381/74

(58) Field of Classification Search
   USPC .................... 324/750.3, 76.39; 381/58, 60, 74
   See application file for complete search history.

(56) References Cited

U.S. PATENT DOCUMENTS

| | | | |
|---|---|---|---|
| 5,245,577 A * | 9/1993 | Duesman et al. | 365/201 |
| 5,625,349 A * | 4/1997 | Disbrow et al. | 340/5.25 |
| 6,281,699 B1 | 8/2001 | Bishop | |
| 6,853,698 B1 * | 2/2005 | Nguyen | 377/29 |
| 7,388,414 B1 * | 6/2008 | Pasqualini | 327/143 |
| 2007/0079036 A1 * | 4/2007 | Mukherjee | 710/119 |
| 2007/0216380 A1 * | 9/2007 | Hack et al. | 323/269 |
| 2010/0231252 A1 * | 9/2010 | Goel et al. | 324/765 |

FOREIGN PATENT DOCUMENTS

| | | | | |
|---|---|---|---|---|
| CN | 101657966 A | 2/2010 | | |
| CN | 102346205 A | 2/2012 | | |
| DE | 3928559 A1 | 4/1990 | | |
| GB | 2222689 A * | 3/1990 | | G01R 31/28 |
| JP | 01280924 A | 11/1989 | | |

* cited by examiner

*Primary Examiner* — Patrick Assouad
*Assistant Examiner* — Alexander J Nemtzow
(74) *Attorney, Agent, or Firm* — Schwegman, Lundberg & Woessner, P.A.

(57) ABSTRACT

This application provides apparatus and methods for initiating tests in an interface circuit without using inputs of the interface circuit dedicated to initiating the tests. In an example, a test mode interface circuit can include a voltage comparator configured compare a first voltage to a second voltage, a ripple counter configured to count pulses from a processor when the voltage comparator indicates that the first voltage is greater than the second voltage, and wherein the test mode interface circuit is configured to provide a test mode enable signal and an indication of the a desired test mode an interface circuit that includes the test mode interface circuit.

7 Claims, 3 Drawing Sheets

NO PIN TEST MODE

CLAIM OF PRIORITY

This patent application claims the benefit of priority, under 35 U.S.C. Section 119(e), to Turner et al., U.S. Provisional Patent Application Ser. No. 61/367,280, entitled "NO PIN TEST MODE" filed on Jul. 23, 2010, which is hereby incorporated by reference herein in its entirety.

BACKGROUND

Mobile computing devices, as well as other electronic devices, provide an array of features, within very compact devices, that make communication, messaging and exchanging of audio and data information transparent to a user. During the manufacturing of these devices, testing is done to reduce the possibility of delivering a device with a defective integrated circuit. At the same time, providing integrated circuits with pins dedicated circuit testing can eliminate the opportunity to provide additional features with a chip or a device that includes the chip.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
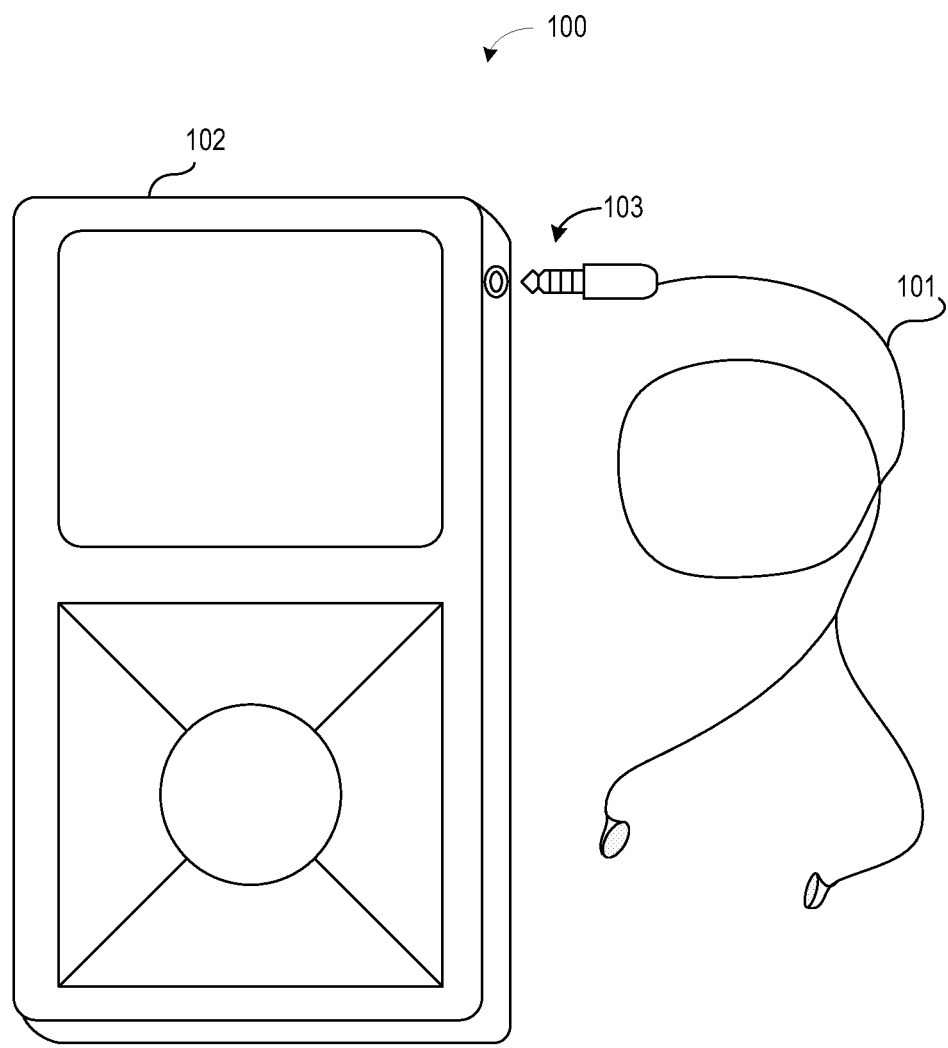
FIG. 1 illustrates generally a system employing an example test mode interface circuit.

The present subject matter includes an interface circuit configured to detect an accessory coupled to an electronic device and automatically process information between a processor of the electronic device and the accessory. More particularly, the present subject matter includes methods and apparatus for an interface circuit, including a test mode interface circuit, that allows testing of the interface circuit without adding inputs or outputs to the interface circuit that are dedicated to the test mode operation, thus reducing manufacturing costs and conserving input and output real estate for additional features of an electronic device that includes the interface circuit.

Circuit manufacturers often test circuits several times during the manufacturing and packaging of the circuit. The testing can assure that further processing is not wasted on a defective circuit. Further testing can also assure that properly functional circuits are procured to the manufacturer's customers. Test modes can allow designers and manufacturing processing teams to observe analog and digital behavior of the circuit that cannot otherwise be visible to the external world. In addition, test modes can bypass delays required for the circuits intended operation but not relevant to the desired test results such that the desired test results can be obtained in a more timely fashion.

Multiple test modes can be designed into the interface circuit and each test mode can focus on a different aspect of the interface circuit to test. Circuit testers can be coupled to the terminations of the circuit to control the circuit during the test and record the results of each test. The present subject matter provides examples of an interface circuit that includes terminations for the intended interface operations of the circuit. The interface circuit can also include one or more test modes that can be initiated, and the results recorded, without need of additional circuit terminations, such as terminations dedicated to the test modes. The present subject matter is advantageous because the circuit does not require additional physical real estate for dedicated testing inputs and outputs that can add manufacturing costs and be an undesirable element of the circuit from the point of view of an electronic device manufacturing using the circuit.

In an example, a test mode of an interface circuit can be entered when a first power supply voltage coupled to the interface circuit is raised above a second power supply voltage coupled to the interface circuit. A switch input, configured to detect an accessory coupled to a port of the electronic device, can be pulsed at a first frequency. An enable signal of the interface circuit can be pulsed at a frequency about twice that of the first frequency such that each rise and fall of the switch input can be sensed. A ripple counter (e.g., a ripple counter based circuit) can count incrementally on the transition of the switch output. Upon cycling bits of the ripple counter to a desired state, or bit pattern, the voltage of the first power supply can be lowered to a point at or below the level of the second power supply voltage to initiate a test mode indicated by the state of one or more of the ripple counter bits.

In an example, a predetermined number of oscillator cycles after the first supply voltage falls below the second supply voltage, the state of the three most significant bits of the ripple counter are captured. If the least significant bit (LSB) of the three upper bits of the ripple counter is at a logic low state, a test mode can be initiated. The remaining 2 bits can indicate a desired test mode to execute. If the LSB of the three upper bits of the ripple counter is HIGH (default state), test mode is not entered, and the ripple counter is reset. In an example, until a test mode is initiated, an accessory detection input to the circuit (J_DET), and an enable input to the circuit (EN), can influence operation of one or more state machines as though a test mode were not being attempted.

FIG. 1 illustrates generally a system 100 employing an interface circuit according to one example of the present subject matter. The system includes an electronic device 102 and an audio accessory 101. In an example, an interface circuit of the electronic device 102 can provide an interface to the audio accessory 101. The electronic device 102 can include a mobile electronic device such as, but not limited to, a cell phone, a personal digital assistant, a personal media player, combinations thereof, or other electronic devices having an audio port. The audio accessory 101 can be a set of earphones or earplugs that includes a connector 103, such as an audio jack, that physically interfaces with an audio port of the electronic device 102. In various examples, the accessory 101 can be a set of earphones or earplugs that include a microphone. In some examples, the microphone can include a switch, such as a send/end switch for initiating and ending a cell phone call, for example. In some examples, the set of earphones or earplugs may include only one earphone or earplug. It is understood that the subject matter herein is not limited to an interface circuit for an audio accessory but can be implanted with other types of accessories as well.

Figure 2:
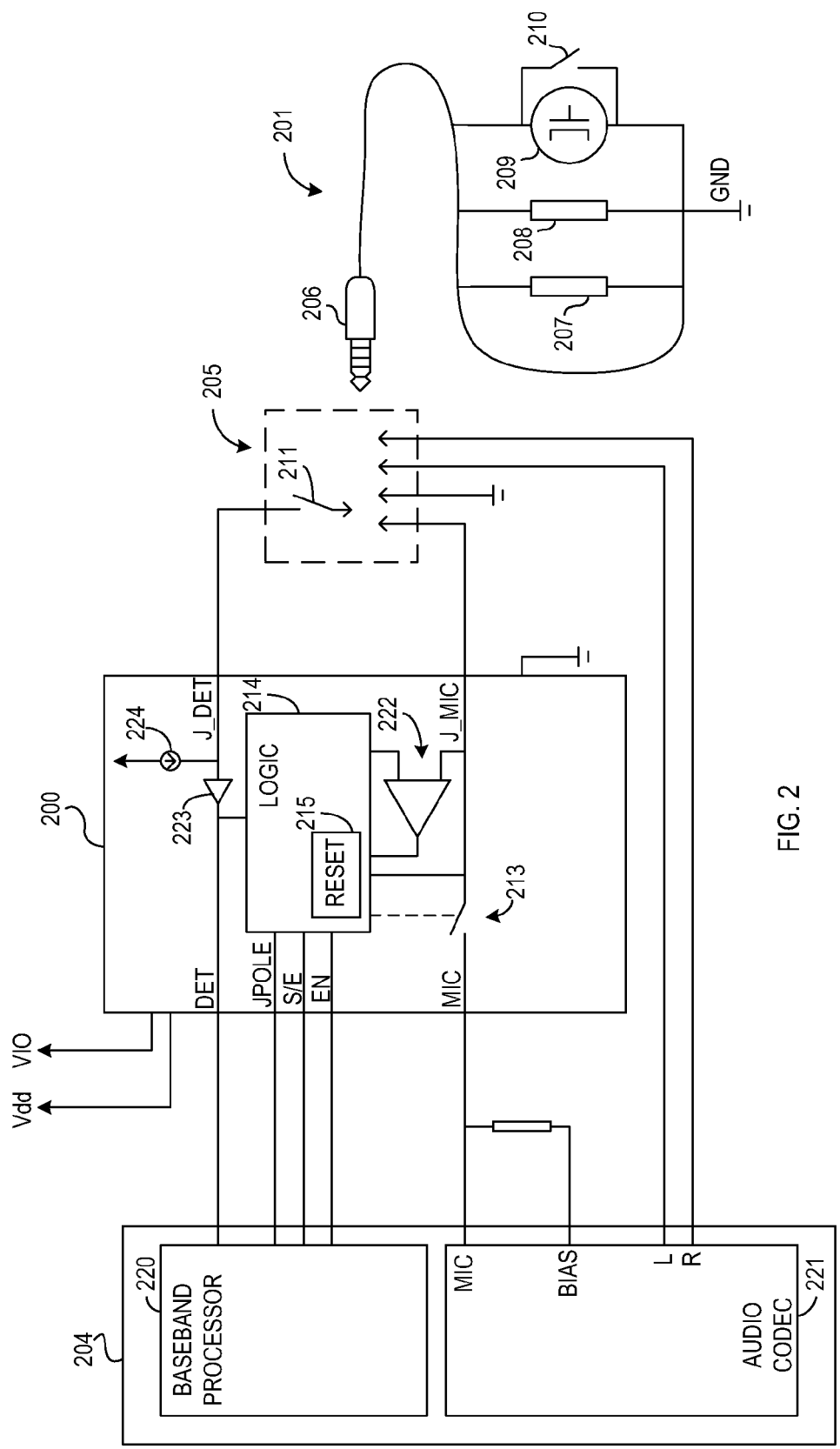
FIG. 2 illustrates generally a block diagram of an example accessory interface circuit of an electronic device.

FIG. 2 illustrates generally a block diagram of an example accessory interface circuit 200 for interfacing an audio accessory 201 to an electronic device processor 204. The accessory interface circuit 200 can include a first power supply input VIO and a second power supply input VDD, various inputs and outputs to couple the accessory interface circuit 200 between a port 205 of the electronic device and the processor 204 of the electronic device. In certain examples, the port 205 can be configured to couple with the connector of an accessory 201, such as an audio jack connector 206. The audio jack connector 206 can include terminations for one or more earphones, such as left and right earphones 207, 208. The audio jack connector 206 can include a ground termination GND. The audio jack connector 206 can include a termination coupled to a microphone 209 of the accessory 201. The audio jack connector 206 can include a termination coupled to a switch 210 of the accessory 201. In an example, the microphone 209 and switch 210 of the accessory 201 share a termination of the connector 206.

In an example, the accessory interface circuit 200 can include a comparator 222 configured to receive a microphone signal at a headset microphone terminal (J_MIC), a Schmitt trigger 223 configured to receive an audio jack detection signal at an audio jack detection pin (J_DET), and a current source 224 (e.g., a 0.5 µA current source, etc.). In an example, the port 205 can include a switch device 211, in certain examples, operating as a normally open switch.

In an example, the current source 224 can be configured to provide a voltage at the Schmitt trigger 223 when the port 205 is empty that can be pulled to ground when an audio jack 206 is coupled with the port 205. In an example, the Schmitt trigger 223 can be configured to provide a detection signal to logic 214 and the processor 204. The detection signal can include a logic high signal when the port 205 is in an uncoupled state and a logic low signal when the port 205 is coupled with an audio jack connector 206 of an accessory 201.

In another example, the normally open configuration of the switch device 211 and the current source 224 (e.g., a 0.5 µA current source, etc.) of the accessory interface circuit 200 can be replaced with a switching device having a normally closed (NC) configuration and a current sink (e.g., a 0.5 µA current sink, etc.). In other examples, one or more other example components or systems can be used. In other examples, the accessory interface circuit 200 can use one or more other components to detect the audio jack 206 and to provide an indication of the detected audio jack to the processor 204.

In certain examples, the accessory interface circuit 200 can include inputs coupled to terminals of the port 205 corresponding to each of the accessory connector terminations. In certain examples, the port 205 can include a JDET switch 207 for detecting the presence of the audio jack connector 206 coupled to, or mated with, the port 205. In some examples, the JDET switch is normally open, and closes when the audio jack connector 206 is coupled to the port 205. In some examples, the JDET switch 207 can be normally closed and can open when an accessory connector is coupled to the port 205. The accessory interface circuit 200 can include a number of outputs for interfacing with the processor 204 of the electronic device. In various examples, the accessory interface circuit 200 can include an output (DET) indicative of whether an accessory 201 is coupled to the port 205.

In certain examples, the accessory interface circuit 200 can include an output (J_POLE) indicative of whether the audio jack connector 206 includes a fourth terminal. Some accessories can include audio jack connectors that have only three signal terminations, or poles. The accessory interface circuit 200 can be configured to accept both three and four pole audio jack connectors. In such examples, the accessory interface circuit 200 can identify whether a coupled audio jack connector is a three pole or four-pole connector and can use the J_POLE output to provide an indication of the audio jack pole configuration to the processor 204.

In an example, the accessory interface circuit 200 can include an output (MIC) for conducting audio information between the accessory and an audio processor 221 of the electronic device. In an example, the accessory interface circuit 200 can include an output (S/E) indicative of a state of a switch 210 of a connected accessory. For example, audio accessories configured for use with a cell phone can include earphones for listening to audio signals from the cell phone, a microphone for receiving sound, and a switch to allow convenient push button connection to an incoming call and termination of a call in-progress.

In some examples, the accessory interface circuit 200 can include an internal switch (S) to reduce leakage current associated with a terminal of the accessory 201 such as the microphone terminal. In such an example, the interface circuit can keep a microphone bias voltage (MIC Bias) isolated from the port 205 until the accessory interface circuit 200 identifies that an accessory 201 is coupled to the port 205. In some examples, the microphone bias voltage can be isolated from the port 205 until the accessory interface circuit 200 identifies that an appropriate accessory connector, such as a four-pole audio jack connector 206, is coupled to the port 205.

In various embodiments, the accessory interface circuit 200 can include an input J_MIC coupled to a terminal of the port 205 corresponding to the terminal of the connector 206 coupled to the microphone 210. In various examples, the port 205 can include a switch 211 for detecting the presence of the accessory connector 206 coupled to, or mated with, the port 205. In an example, the switch 211 can be coupled to a detection input, J_DET, of the accessory interface circuit 200. In some examples, the switch 211 is normally open and can close when an accessory connector 206 is coupled to the port 205. In certain examples, the accessory interface circuit 200 can include a number of outputs DET, JPOLE, S/E, MIC, for interfacing with the processor 204 of the electronic device. In various examples, the accessory interface circuit 200 includes an output DET indicative of whether an accessory 201 is coupled to the port 205. In an example, the accessory interface circuit 200 can include an output JPOLE indicative of whether the accessory connector 206 includes a third terminal, or a third and a fourth terminal. In an example, the accessory interface circuit 200 can include an output S/E indicative of a state of a switch 210 of the connected accessory 201. In an example, the accessory interface circuit 200 can include an output MIC for conducting audio information between the accessory 201 and an audio processor 212 of the electronic device. In some examples, the accessory interface circuit 200 includes an internal switch 213 to reduce leakage current associated with a terminal of the accessory 201 such as the microphone terminal MIC of the connector 206. In certain examples, the accessory interface circuit 200 can include logic 214 to receive process and generate information between the electronic device processor 204 and the accessory 201. In certain examples, the device processor 204 can include a baseband processor 220. In certain examples, the device processor 204 can include an audio coder/decoder (CODEC). In certain examples, the device processor can include a baseband processor and an audio CODEC. In certain examples, the audio CODEC can provide a bias output, BIAS, to bias an accessory microphone 210. In an example, the accessory interface circuit 200 can include a comparator 222 to compare the signal level of the J_MIC input to a reference voltage. When a user presses a switch 210 of the accessory device, the comparator 222 can provide an indication of the switch action to the device processor 204 using the S/E output. In certain examples, the accessory interface circuit 200 can receive an enable input EN from the device processor 204. In an example, the EN input can enable the accessory interface circuit 200. In an example, the EN input can be used to program or test the accessory interface circuit 200.

In various examples, the accessory interface circuit 200 can reduce the number of inputs and outputs required to interface an accessory 201 to the electronic device processor 204, thus freeing up valuable inputs and outputs for other resources of the electronic device. In certain examples, the accessory interface circuit 200 can offload processing that would otherwise consume processing bandwidth of the electronic device processor 204. Thus, the accessory interface circuit 200 can free up processing bandwidth for other processing tasks. In various examples, the accessory interface circuit 200 can be implemented using discrete components. In some examples, the accessory interface circuit 200 can be implemented in software. In some examples, the accessory interface circuit 200 can be implemented using a combination of discrete components and software. In some examples, the accessory interface circuit 200 can be implemented using a single integrated circuit chip. In various examples, the accessory interface circuit 200 can include a reset circuit 215 for monitoring the presence of an accessory 201 coupled to the port 205 and for reducing power consumption of the accessory interface circuit 200 when the port 205 is not coupled to an accessory 201.

Figure 3:
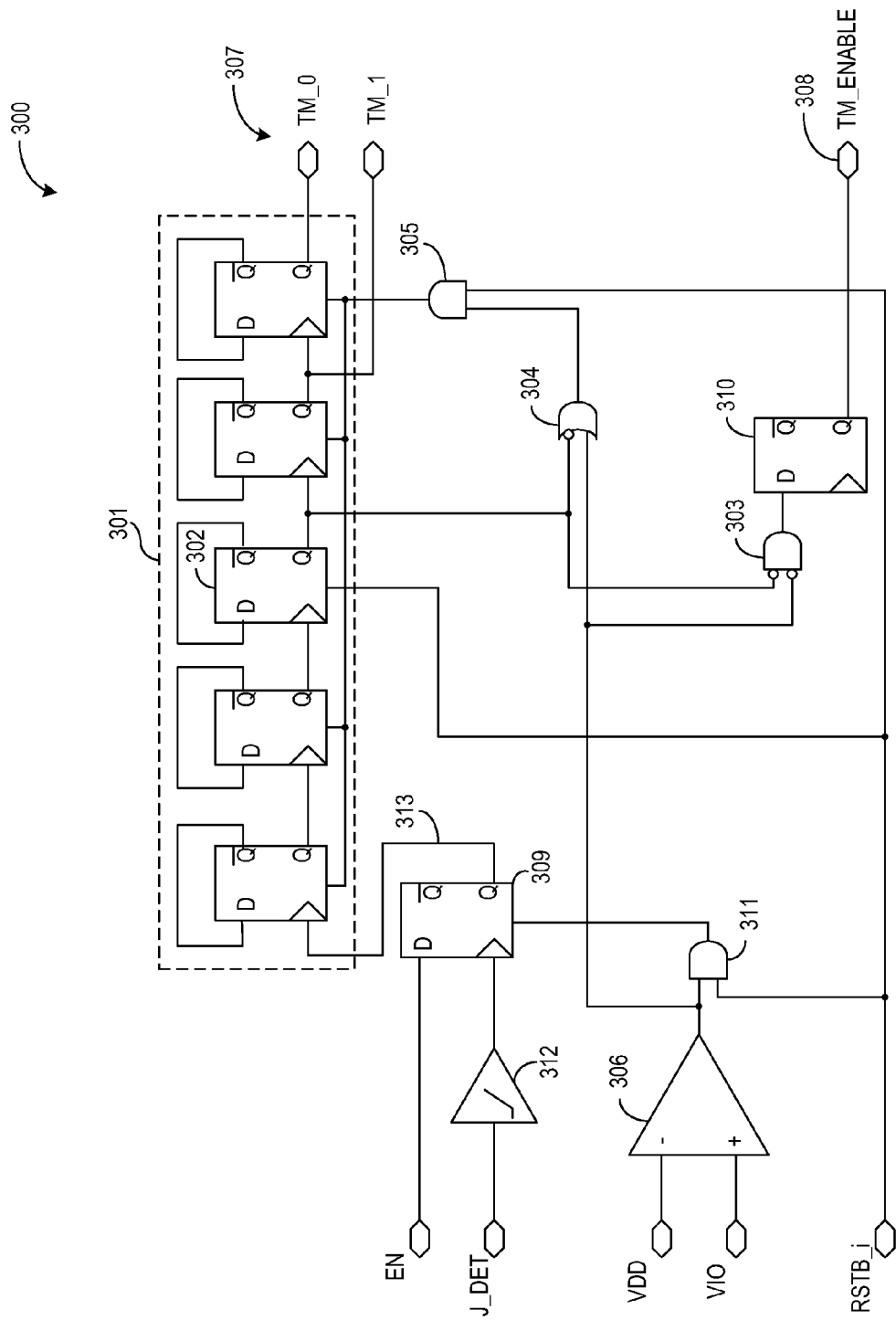
FIG. 3 illustrates generally an example test mode interface circuit of an accessory interface circuit.

FIG. 3 illustrates generally a test mode interface circuit 300 of an interface circuit according to one example of the present subject matter. In an example, the test mode interface circuit 300 can include a ripple counter 301 responsive to a first input EN and second input J_DET of the interface circuit. In an example, the test mode interface circuit 300 can include a voltage comparator 306, such as a 1-volt voltage comparator, responsive to a first supply voltage VIO and a second supply voltage VDD. In an example, the output of the voltage comparator 306 can provide an indication of the relative levels of the first and second supply voltages VIO, VDD. In an example, the test mode interface circuit 300 can respond to a reset input RSTB_i of the interface circuit. In an example, the reset input RSTB_i can be an internal signal of the interface circuit and does not occupy a physical external termination of the interface circuit. In an example, the test mode interface circuit 300 can include outputs 307, 308 to the logic of the interface circuit. The outputs 307, 308 can include one or more bits TM_0, TM_1 to indicate a particular test mode to initiate and an enable bit TM_ENABLE to initiate the particular test mode. Because the test mode interface circuit 300 does not rely on dedicated test inputs of the interface circuit, the test mode interface circuit 300 can also include logic to reduce the possibility of initializing a test mode after the interface circuit is assembled within an end-user device. The additional logic can constrain the initialization of a test mode to a particular sequence of signal transitions of the first voltage VIO, the second voltage VDD, the first input EN, and the second input J_DET. In the illustrated example, the first voltage VIO input level must be higher than the second voltage VDD input level, and the active low reset RSTB_i must be at a high logic level at a first gate 311 to enable a flip-flop 309 coupled to the ripple counter 301. With the flip-flop 309 couple to an input of the ripple counter 301 enabled, transitions of the first input EN and the second input J_DET can load the ripple counter 301 with a desired bit pattern. In certain examples, the first input EN can be pulsed at a higher frequency than the second input J_DET to provide a clock signal 313 to the ripple counter 301. In an example, the first input EN can be pulsed at about or more than twice the frequency of the second input J_DET to capture each rise and fall of the second input J_DET to provide the clock signal to the ripple counter 301. In an example, a buffer 312 can be used to shape a transition of the J_DET input to ensure each transition of J_DET is detected. In certain examples, transitions on the clock signal 313 of the ripple counter 301 can pass the ripple counter bits to each successive flip-flop in the ripple counter 301. In an example, the three bits in the most downstream location of the ripple counter 301 can determine if a test mode will be initiated and what particular test mode can initiate. In an example, a transition of a level of the first input voltage VIO, from above the second input voltage VDD to below the second input voltage VDD, can initiate test mode execution. In an example, the last two downstream bit locations of the ripple counter 301 can determine what particular test mode is executed. It understood that more or less test modes can be available for selection without departing from the scope of the present subject matter. For example, but not by way of limitation, more or less test modes can be made available by using more or less flip-flops in the ripple counter 301.

In the illustrated example, an initialization flip-flop 302 can determine if a test mode can be initialized on the transition of the first voltage VIO level from a level higher that the second input voltage VDD level to a level lower than the second input voltage VDD level. If the logic level of the Q output of the initialization flip-flop 302 is low at the voltage transition, the output of gate 303 can assume a high logic state enabling the test mode using the TM_ENABLE output of the test mode interface circuit. If the logic level of the Q output of the initialization flip-flop 302 is high at the voltage transition, the output of gate 304 can assume a low logic state disabling and clearing, or resetting, various bits of the ripple counter through gate 305. In addition, the test mode enable output TM_ENABLE of the test mode interface circuit 300 can remain at a low logic level, thus not providing the logic of the interface circuit with an indication of a desired test mode initialization. The ripple counter 301 can also be disabled when the active low reset RSTB_i assumes a low logic level. In an example, one or more bits of the ripple counter can be cleared when the ripple counter is reset. The above sequence of initializing a test mode works to prevent a test mode from initializing when not intended. In an example, the test mode enable output TM_ENABLE can be latched using an output latch flip-flop 310.

In an example, the reset signal RSTB_i can be ANDed 311 with the output of the voltage comparator 306 to reset a clock flip-flop 312 of the ripple counter 301. In an example, the reset signal RSTB_i can be coupled to the initialization flip-flop 302 of the ripple counter 301 to reset the output of the initialization flip-flop 302 as well as the test mode enable output TM_ENABLE. In an example, the reset input RSTB_i can reset the output latch flip-flop 310. In an example, the reset input RSTB_i can reset one or more bits of the ripple counter through gate 305.

In an example, an interface circuit 200 can include one or more test modes initiated using a test mode interface circuit 300. In an example, a test mode can be initiated to observe the J_MIC signal comparator and allows bypassing debounce of the J_DET signal. The method to initiate the test mode can include establishing VIO greater than or equal to VDD plus about 1.5 volts, pulsing J_DET four times with eight pulses of EN, establishing VIO equal to VDD, and establishing a low logic level on J_DET for about 50 μs. The test can use the DET output as the DET override input of the interface circuit and a representation of the J_MIC comparator can be observed on the S/E output of the interface circuit.

In an example, a test mode can be initiated to bypass the oscillator. The method to initiate the test mode includes raising the first supply voltage VIO greater than or equal to the second supply voltage VDD plus 1.5 volts, pulsing J_DET twelve times with twenty-four pulses of EN, lowering VIO equal to VDD, and establishing a low logic level on J_DET for about 50 μs. The test can use the DET output as the oscillator override input to the interface circuit.

In an example, a test mode can be initiated to observe the oscillator. The method to initiate the test mode can include establishing VIO greater than or equal to VDD plus 1.5 volts, pulsing J_DET twenty times with forty pulses of EN, establishing VIO equal to VDD, and establishing a low logic level on J_DET for about 50 μs. The test can use the DET output to observe a representation of the oscillator signal.

In an example, a test mode can be initiated to observe, or scan various circuit values of components such as flip-flops of the interface circuit. The method to initiate the test mode includes establishing VIO greater than or equal to VDD plus 1.5 volts, pulsing J_DET twenty-eight times with fifty-six pulses of EN, establishing VIO equal to VDD, and establishing a low logic level on J_DET for about 50 μs. J_DET can be used as a shift enable input that shifts the internal components from their functional states to a test configuration state. In an example, a test configuration state configures the flip-flops as a shift register. EN can be used as an input to the shift register and S/E can be used to observe the output of the shift register. The test can use the DET as an input for a tester controlled clock to shift bits through the test mode shift register and compare the outputs observed on S/E to expected outputs to determine functionality of the devices tested using the shift register configuration of the test mode.

In an example, a method holds VIO>VDD, toggles EN twice as fast as JDET until ripple counter is in correct state; lowers VIO to VDD; waits about 60 μs; circuit is now in one of four tests modes.

Additional Notes

In Example 1, a test mode interface circuit includes a voltage comparator configured compare a first voltage to a second voltage, a ripple counter configured to count pulses from a processor when the voltage comparator indicates that the first voltage is greater than the second voltage, and wherein the test mode interface circuit is configured to provide a test mode enable signal and to provide an indication of a desired test mode to an interface circuit that includes the test mode interface circuit.

In Example 2, the test mode interface circuit of Example 1 optionally includes logic configured to enable the ripple counter when the voltage comparator indicates that the first voltage is greater than the second voltage and to provide an active test mode enable signal when the voltage comparator indicates that the first voltage is less than the second voltage and a predetermined bit of the ripple counter is in a predetermined state.

In Example 3, the voltage comparator of any one or more of Example 1-2 is optionally configured to indicate that the first voltage is greater than the second voltage with a high logic level and the predetermined bit of the ripple counter of any one or more of Examples 1-2 is optionally configured to indicate the predetermined state with a low logic level.

In Example 4, the test mode interface circuit of any one or more of examples 1-3 optionally includes a first flip-flop configured to receive a clock signal and a data signal, wherein an output of the first flip-flop is coupled to a clock input of the ripple counter.

In Example 5, the test mode interface circuit of any one or more of Example 1-4 optionally includes a reset input coupled to the ripple counter, the reset input configured to receive a reset signal, to clear the ripple counter when the reset signal is in a first state, and to enable the ripple counter when the reset signal is in a second state.

In Example 6, the test mode interface circuit of any one or more of Examples 1-5 optionally includes a flip-flop configured to latch the test mode enable signal.

In Example 7, a method includes comparing a first voltage to a second voltage using a voltage comparator, counting pulses from a processor using a ripple counter of the test mode interface circuit when the voltage comparator indicates that the first voltage is greater than the second voltage, and providing a test mode enable signal and an indication of the a desired test mode to an interface circuit including the test mode interface circuit when the voltage comparator indicates that the first voltage is less than or equal to the second voltage.

In Example 8, the method of any one or more of Examples 1-7 optionally includes raising the first voltage, enabling the ripple counter when the first voltage exceeds the second voltage, cycling the ripple counter to provide a bit pattern indicative of the desired test, lowering the first voltage to provide the test mode enable signal, and providing the test mode enable signal to the interface circuit.

In Example 9, the method of any one or more of Examples 1-8 optionally includes receiving an active reset signal at the test mode interface circuit, resetting the test mode enable signal in response to the active reset signal, and clearing the ripple counter in response to the active reset signal.

In Example 10, the cycling the ripple counter of any one or more of Examples 1-9 optionally includes receiving a first pulse train at a data input of a flip-flop coupled to an input of the ripple counter, and receiving a second pulse train at a clock input of the flip-flop.

In Example 11, the cycling the ripple counter of any one or more of Examples 1-10 optionally includes a frequency of the first pulse train that is greater than a frequency of the second pulse train.

In Example 12, the providing the test mode enable signal of any one or more of Examples 1-11 optionally includes latching the test mode enable signal.

In Example 13, a mobile electronic system includes a processor, an accessory port, and an accessory interface circuit coupled to the processor and the accessory port. The accessory interface circuit includes a test mode interface circuit, the test mode interface circuit includes a voltage comparator configured compare a first voltage to a second voltage, a ripple counter configured to count pulses from a processor when the voltage comparator indicates that the first voltage is greater than the second voltage, and wherein the test mode interface circuit is configured to provide a test mode enable signal and an indication of the a desired test mode the accessory interface circuit when the voltage comparator indicates that the first voltage is less than the second voltage, a detection terminal coupled to a terminal of the processor, and an enable input coupled to an output of the processor.

In Example 14 the test mode interface circuit of any one or more of Examples 1-13 optionally includes a first flip-flop having a data input, a clock input and an output coupled to a clock input of the ripple counter, the first flip-flop configured to receive the enable signal at a data input, to receive the detection signal at the clock input and to cycle the ripple counter using the output.

In Examples 15, the interface circuit of any one or more of Examples 1-14, in response to the test enable signal from the test mode interface circuit and a first bit pattern indicative of the desired test mode, is optionally configured to receive a detection override signal from the processor and to provide an output of a microphone comparator to a Send/End output of the interface circuit, wherein the microphone comparator is coupled to a microphone input of the accessory port.

In Example 16, the interface circuit of any one or more of Examples 1-15, in response to an active test enable signal from the test mode interface circuit and a second bit pattern indicative of the desired test mode, is optionally configured to receive an oscillator bypass signal from the processor at the detection terminal, wherein the oscillator bypass signal is configured to control an oscillator of the accessory interface circuit.

In Example 17, the interface circuit of any one or more of Examples 1-16, in response to an active test enable signal from the test mode interface circuit and a third bit pattern indicative of the desired test mode, is configured to provide a representation of an output of the oscillator of the interface circuit to the processor using the detection terminal.

In Example 18, the interface circuit of any one or more of Examples 1-17, in response to an active test enable signal and a fourth bit pattern indicative of the desired test mode, is configured to configure the ripple counter into a shift register and the interface circuit is configured to provide a test signal representative of a selected interface circuit signal on the Send/End output, wherein the value of the shift register indicates the selected interface circuit signal of a plurality of interface circuit signals.

In Example 19, the detection terminal of any one or more of Examples 1-18 is optionally configured receive shift register clock signals and the enable input of any one or more of Examples 1-18 is optionally configured to receive shift register data input.

In Example 20, the accessory interface circuit of any one or more of Examples 1-19 optionally does not include an input dedicated to initiating a test mode.

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A mobile electronic device comprising:
   a processor;
   an accessory port; and
   an accessory interface circuit coupled to the processor and the accessory port, the accessory interface circuit including:
      a test mode interface circuit, the test mode interface circuit including:

a voltage comparator configured compare a first voltage to a second voltage;

a ripple counter configured to count pulses from the processor when the voltage comparator indicates that the first voltage is greater than the second voltage;

wherein the test mode interface circuit is configured to provide a test mode enable signal and an indication of a desired test mode of a plurality of test modes of the accessory interface circuit; and wherein the indication includes each state of a plurality of bits of the ripple counter;

a detection terminal coupled to a terminal of the processor;

an enable input coupled to an output of the processor; and wherein the accessory interface circuit, in response to the test enable signal from the test mode interface circuit and a first bit pattern indicative of the desired test mode, is configured to receive a detection override signal from the processor and to provide an output of a microphone comparator to a Send/End output of the interface circuit, wherein the microphone comparator is coupled to a microphone input of the accessory port.

2. The mobile electronic device of claim 1, wherein the test mode interface circuit includes a first flip-flop having a data input, a clock input and an output coupled to a clock input of the ripple counter, the first flip-flop configured to receive an enable signal from the processor at the data input, to receive a detection signal at the clock input and to cycle the ripple counter using the output.

3. The mobile electronic device of claim 1, wherein the accessory interface circuit, in response to an active state of the test mode enable signal from the test mode interface circuit and a second bit pattern indicative of the desired test mode, is configured to receive an oscillator bypass signal from the processor at the detection terminal, wherein the oscillator bypass signal is configured to control an oscillator of the accessory interface circuit.

4. The mobile electronic device of claim 3, wherein the accessory interface circuit, in response to an active state of the test mode enable signal from the test mode interface circuit and a third bit pattern indicative of the desired test mode, is configured to provide a representation of an output of the oscillator of the interface circuit to the processor using the detection terminal.

5. The mobile electronic device of claim 4, wherein the test interface circuit, in response to an active state of the test mode enable signal and a fourth bit pattern indicative of the desired test mode, is configured to configure the ripple counter into a shift register and the interface circuit is configured to provide a test signal representative of a selected interface circuit signal on the Send/End output, wherein the value of the shift register indicates the selected interface circuit signal of a plurality of interface circuit signals.

6. The mobile electronic device of claim 5, wherein the detection terminal is configured receive shift register clock signals and the enable input is configured to receive shift register data input.

7. The mobile electronic device of claim 1, wherein the accessory interface circuit does not include an input dedicated to initiating a test mode.

* * * * *